US010665626B2

(12) United States Patent
Zhao et al.

(10) Patent No.: US 10,665,626 B2
(45) Date of Patent: May 26, 2020

(54) HIGH DYNAMIC RANGE IMAGE SENSORS

(71) Applicant: OmniVision Technologies, Inc., Santa Clara, CA (US)

(72) Inventors: Cheng Zhao, San Jose, CA (US);
Chen-Wei Lu, San Jose, CA (US);
Zhiqiang Lin, San Jose, CA (US);
Dyson Hsin-Chih Tai, San Jose, CA (US)

(*) Notice: Subject to any disclaimer, the term of this patent is extended or adjusted under 35 U.S.C. 154(b) by 31 days.

(21) Appl. No.: 15/962,943

(22) Filed: Apr. 25, 2018

(65) Prior Publication Data

US 2019/0333953 A1 Oct. 31, 2019

(51) Int. Cl.
*H01L 27/146* (2006.01)
(52) U.S. Cl.
CPC .. *H01L 27/14627* (2013.01); *H01L 27/14621* (2013.01); *H01L 27/14629* (2013.01); *H01L 27/14685* (2013.01)
(58) Field of Classification Search
CPC ......... H01L 27/14627; H01L 27/14685; H01L 27/14629; H01L 27/14621; H01L 27/14605
See application file for complete search history.

(56) References Cited

U.S. PATENT DOCUMENTS

| 2009/0065684 | A1* | 3/2009 | Kim | H01L 27/14621 250/226 |
| 2012/0086093 | A1* | 4/2012 | Otsuka | H01L 27/14621 257/432 |
| 2013/0082163 | A1* | 4/2013 | Chen | H01L 27/14627 250/208.1 |
| 2014/0306360 | A1* | 10/2014 | Li | B05D 1/005 264/1.7 |
| 2015/0115382 | A1* | 4/2015 | Wu | H01L 27/14627 257/432 |
| 2018/0007324 | A1 | 1/2018 | Chen et al. | |
| 2018/0090538 | A1 | 3/2018 | Wang et al. | |

* cited by examiner

*Primary Examiner* — Steven H Loke
*Assistant Examiner* — Juanita B Rhodes

(57) ABSTRACT

An image sensor comprises a first photodiode and a second photodiode having a smaller full-well capacitance than the first photodiode, wherein the second photodiode is adjacent to the first photodiode; a first micro-lens is disposed above the first photodiode and on an illuminated side of the image sensor; a second micro-lens is disposed above the second photodiode and on the illuminated side of the image sensor; and a coating layer disposed on both the first and second micro-lens, wherein the coating layer forms a flat top surface on the second micro-lens and a conformal coating layer on the first micro-lens.

21 Claims, 6 Drawing Sheets

HIGH DYNAMIC RANGE IMAGE SENSORS

TECHNICAL FIELD

This disclosure relates generally to semiconductor image sensors, and in particular but not exclusively, relates to high dynamic range (HDR) image sensors with improved cross talk and angular response.

BACKGROUND INFORMATION

Image sensors have become ubiquitous. They are widely used in digital still cameras, cellular phones, security cameras, as well as medical, automobile and other applications. Color sensitive digital imagers are well known. Typically color imagers are comprised of a plurality of image sensor pixels, each being sensitive to light of one of three different colors. For high dynamic range (HDR) image sensors, the big-small pixel scheme is often used, wherein some of the pixels are larger than others. The big-small scheme facilitates the capture of images with a higher dynamic range (HDR) and provides more details in images with widely varying local light intensities. In areas of the image with lower light intensity, the big pixels will be sampled, because they are more sensitive to the light. In areas of the image with high light intensity, the small pixels will be sampled, because they are less sensitive to the light, therefore, will be less likely to become saturated. The resultant image has a higher dynamic range, and shows more details in both high and low light areas.

In order to further improve the performance of the small pixels, an extra attenuation layer is usually disposed over the small pixels to block a portion of the light from reaching the small pixels. The attenuation layer is usually made of dark pigment material which has thickness at least 1 μm. Such thick attenuation layer may cause several problems, such as worse cross talk between adjacent pixels and non-uniform angular response between small pixels and big pixels.

BRIEF DESCRIPTION OF THE DRAWINGS

Non-limiting and non-exhaustive examples of the invention are described with reference to the following figures, wherein like reference numerals refer to like parts throughout the various views unless otherwise specified.

Figure 1:
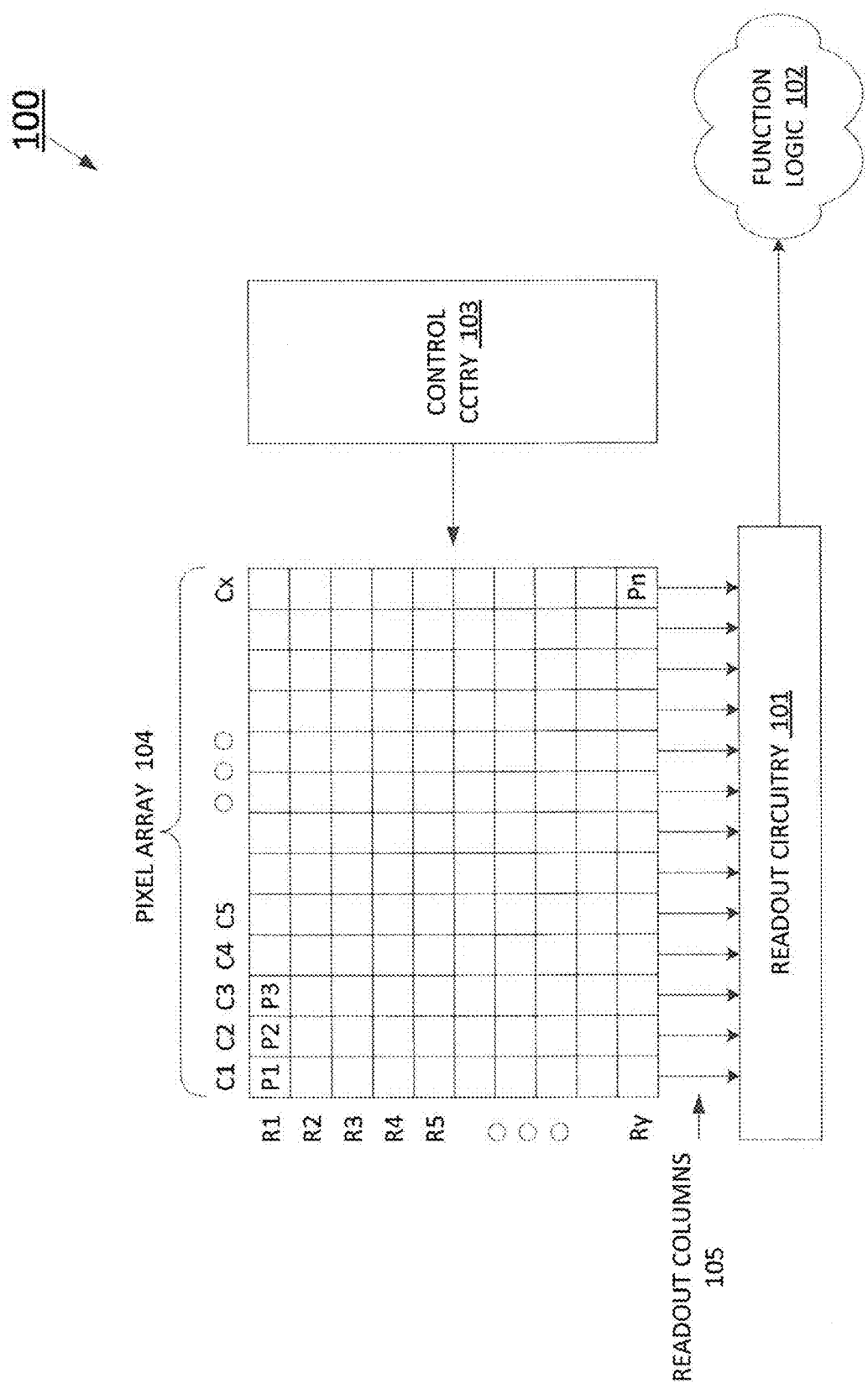
FIG. 1 is a block diagram schematically illustrating one example of an imaging system, in accordance with an embodiment of the invention.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the present invention. Also, common but well-understood elements that are useful or necessary in a commercially feasible embodiment are often not depicted in order to facilitate a less obstructed view of these various embodiments of the present invention.

DETAILED DESCRIPTION

Examples of an apparatus and method for an image sensor with improved cross talk and angular response are described herein. In the following description, numerous specific details are set forth to provide a thorough understanding of the examples. However, one skilled in the relevant art will recognize that the techniques described herein can be practiced without one or more of the specific details, or with other methods, components, materials, etc. In other instances, well-known structures, materials, or operations are not shown or described in details in order to avoid obscuring certain aspects.

Reference throughout this specification to "one example" or "one embodiment" means that a particular feature, structure, or characteristic described in connection with the example is included in at least one example of the present invention. Thus, the appearances of the phrases "in one example" or "in one embodiment" in various places throughout this specification are not necessarily all referring to the same example. Furthermore, the particular features, structures, or characteristics may be combined in any suitable manner in one or more examples.

Throughout this specification, several terms of art are used. These terms are to take on their ordinary meaning in the art from which they come, unless specifically defined herein or the context of their use would clearly suggest otherwise. It should be noted that element names and symbols may be used interchangeably through this document (e.g., Si vs. silicon); however, both have identical meanings.

FIG. 1 is a block diagram illustrating one example of imaging system 100.

Imaging system 100 includes pixel array 104, control circuitry 103, readout circuitry 101, and function logic 102. In one example, pixel array 104 is a two-dimensional (2D) array of photodiodes, or image sensor pixels (e.g., pixels P1, P2 . . . , Pn). As illustrated, photodiodes are arranged into rows (e.g., rows R1 to Ry) and columns (e.g., column C1 to Cx) to acquire image data of a person, place, object, etc., which can then be used to render a 2D image of the person, place, object, etc. However, in other examples, it is appreciated that the photodiodes do not have to be arranged into rows and columns and may take other configurations.

In one example, after the image sensor photodiode/pixel in pixel array 104 has acquired its image data or image charge, the image data is readout by readout circuitry 101 and then transferred to functional logic 102. In various examples, readout circuitry 101 may include amplification circuitry, analog-to-digital (ADC) conversion circuitry, or otherwise. Function logic 102 may simply store the image data or even manipulate the image data by applying post image effects (e.g., crop, rotate, remove red eye, adjust brightness, adjust contrast, or otherwise). In one example, readout circuitry 101 may read out a row of image data at a time along readout column lines (illustrated) or may readout the image data using a variety of other techniques (not illustrated), such as a serial readout or a full parallel readout of all pixels simultaneously.

In one example, control circuitry 103 is coupled to pixel array 104 to control operation of the plurality of photodiodes in pixel array 104. For example, control circuitry 103 may generate a shutter signal for controlling image acquisition. In one example, the shutter signal is a global shutter signal for simultaneously enabling all pixels within pixel array 104 to simultaneously capture their respective image data during a single acquisition window. In another example, the shutter signal is a rolling shutter signal such that each row, column, or group of pixels is sequentially enabled during consecutive acquisition windows. In another example, image acquisition is synchronized with lighting effects such as a flash.

In one example, imaging system 100 may be included in a digital camera, cell phone, laptop computer, automobile or the like. Additionally, imaging system 100 may be coupled to other pieces of hardware such as a processor (general purpose or otherwise), memory elements, output (USB port, wireless transmitter, HDMI port, etc.), lighting/flash, electrical input (keyboard, touch display, track pad, mouse, microphone, etc.), and/or display. Other pieces of hardware may deliver instructions to imaging system 100, extract image data from imaging system 100, or manipulate image data supplied by imaging system 100.

Figure 2:
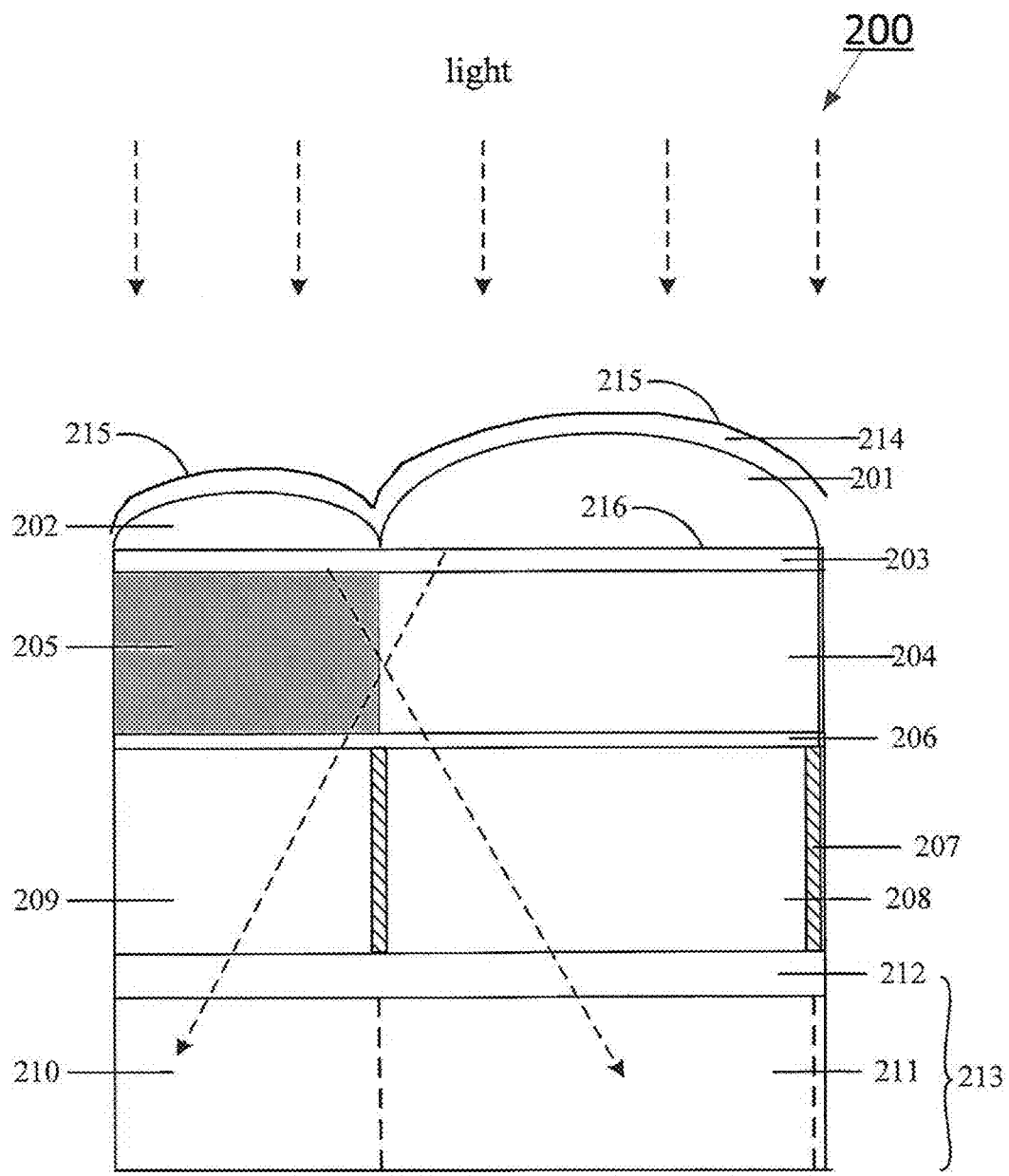
FIG. 2 is a cross-sectional view of an imaging sensor with a big-small pixel scheme.

As a depicted example, FIG. 2 is a cross-sectional view of an imaging sensor 200 with a big-small pixel scheme. The image sensor 200 may be either a front side illuminated (FSI) image sensor or a backside illuminated (BSI) image sensor. In a depicted example in FIG. 2, the image sensor 200 comprises a first photodiode 211 and a second photodiode 210 disposed in the semiconductor substrate 213, wherein the second photodiode 210 is laterally adjacent to the first photodiode 211 with either a diffusion isolation region or a trench isolation region in between. The second photodiode 210 has a smaller full-well capacitance than the first photodiode 211.

In the depicted example in FIG. 2, a first micro-lens 201 is disposed above the first photodiode 211 and on an illuminated side of the image sensor 200. A second micro-lens 202 is disposed above the second photodiode 210 and on the illuminated side of the image sensor 200. The second micro-lens 202 is smaller than the first micro-lens 201 and laterally abuts the first micro-lens 201 without gap in between. A conformal coating layer 214 is disposed on both a surface of the first micro-lens 201 and a surface of the second micro-lens 202 to form a continuous conformal coating surface 215 in order to protect micro-lens. The conformal coating layer 214 has a refractive index lower than a refractive index of the first micro-lens 201 and a refractive index of the second micro-lens 202. As an example, the refractive index of the conformal coating layer 214 is approximately 1.45 while the refractive index of the micro-lens 201 and 202 is approximately 1.65.

In the depicted example in FIG. 2, a first filter layer 208 is disposed between the first micro-lens 201 and the first photodiode 211, and configured to pass light within a first range of wavelengths. A second filter layer 209 is disposed between the second micro-lens 202 and the second photodiode 210, and configured to pass light within a second range of wavelengths. The second filter layer 209 and the first filter layer 208 have same thickness, and they are laterally adjacent to each other with a reflective grid 207 in between to reflect back the incident light from adjacent pixels so as to reduce the cross talk. The reflective grid 207 has a height more than 50% of the thickness of the first filter layer 208 and the second filter layer 209, and comprises at least one of TiN and W.

In the depicted example in FIG. 2, interlayer 203, 206 and 212 are disposed between vertically adjacent films in order to achieve better film deposition, film isolation, film adhesion and film protection during the process. They may be a single layer or multiple layer film stacks which comprise at least one of dielectric materials with a refractive index higher than the refractive index of micro-lens 201 and 202. For FSI image sensor 200, the interlayer 212 may also comprise periphery circuitry interconnections. For BSI image sensor 200, the interlayer 212 may also comprise a negative fixed charge film such as $HfO_x$ in order to form a P+ pinning layer on the semiconductor substrate surface so as to reduce the dark current caused by the hot electrons.

In the depicted example in FIG. 2, a gray layer 205 is disposed as an attenuation layer above the second image sensor 210 and between the second filter layer 209 and the second micro-lens 202 in order to block a portion of image light from reaching the second photodiode 210. A clean layer 204 is disposed above the first image sensor 211 and between the first micro-lens 201 and the first filter layer 208 without blocking any image light. The gray layer 205 and the clean layer 204 have same thickness and are laterally adjacent to each other. The gray layer 205 is usually made of a dark pigment material with thickness at least 1 μm in order to get enough attenuation effect. The incident light may be easier to reach adjacent pixels through the thick film, which causes worse optical cross talk between adjacent pixels. Moreover, since the small pixels have higher aspect ratio than the adjacent large pixels, the angular performance between the small pixels and the adjacent large pixels are not uniform. Such non-uniform angular performance will degrade the optical performance of the HDR camera as well.

Figure 3:
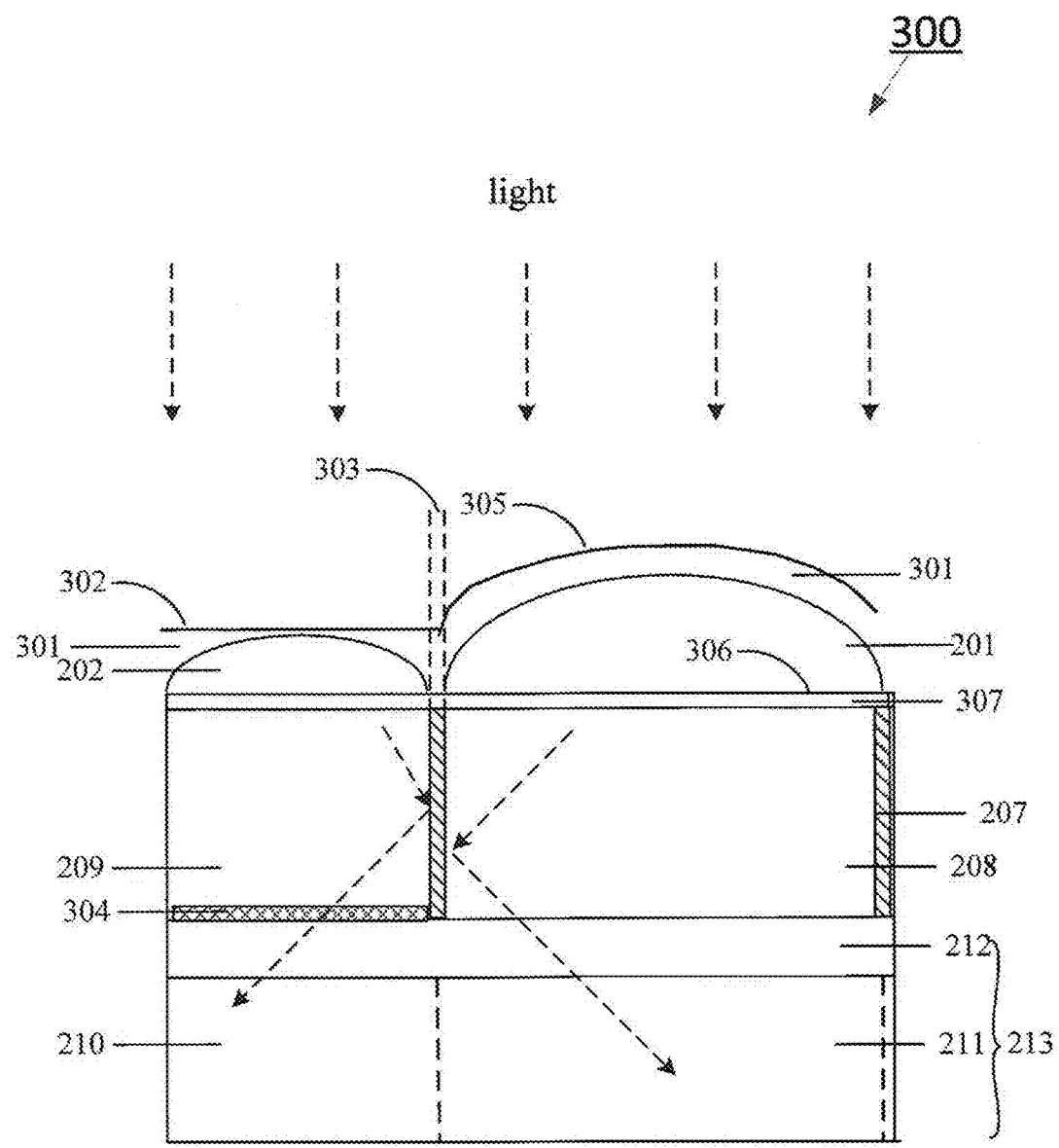
FIG. 3 is a cross-sectional view of an improved imaging sensor with big-small pixel scheme, in accordance with an embodiment of the invention.

As a depicted example, FIG. 3 is a cross-sectional view of an improved imaging sensor 300 with big-small pixel scheme, in accordance with an embodiment of the invention. Compared to the image sensor 200 in FIG. 2, the image sensor 300 does not have the thick gray layer 205 and the clean layer 204. Instead, the image sensor 300 comprises a thin attenuation layer 304 disposed between the second photodiode 210 and the second micro-lens 202 to block a portion of image light from reaching the second photodiode 210. The thin attenuation layer 304 comprises at least one of TiN, Al, $Al_2O_3$, AlCu, Cu, Ti, Ta, Ag, W, $TiO_2$, $SiO_2$, $ZrO_2$, TaO, SiN, SiNO, and $HfO_x$. The thickness of the attenuation layer 304 is in the order of nanometers only. In one example, 70 nm TiN is used as the attenuation layer to produce 3~4% quantum efficiency (QE) for small pixels. As a result, the optical cross talk between adjacent pixels is significantly reduced. Moreover, since the thin attenuation layer 304 does not cause substantially increase for the aspect ratio of the small pixels, the angular performance between the small pixels and the adjacent large pixels becomes more uniform as well. It will significantly improve the optical performance of the HDR camera.

As a depicted example in FIG. 3, in order to further improve the angular performance besides protecting microlens, a coating layer 301 is disposed on both the first micro-lens 201 and the second micro-lens 202. The coating layer 301 forms a flat top surface 302 on the second micro-lens 202, and extends to cover the first micro-lens 201 and form a conformal coating surface 305 on the first micro-lens 201. The flat top surface 302 is specially designed to improve the angular performance. The coating layer 301 has a refractive index lower than a refractive index of the first micro-lens 201 and a refractive index of the second micro-lens 202. Compared to the refractive index of the conformal coating layer 214 in FIG. 2, which is mainly used to protect the micro-lens, the refractive index of the coating layer 301 is required to be even lower in order to further improve the angular performance besides protecting micro-lens. In an example, at 530 nm wavelength, the refractive index of the coating layer 301 is approximately 1.25 while the refractive index of the micro-lens 201 and 202 is approximately 1.65. As a result, the angular performance is improved by 400% at 30 degree incident angle.

Figure 4:
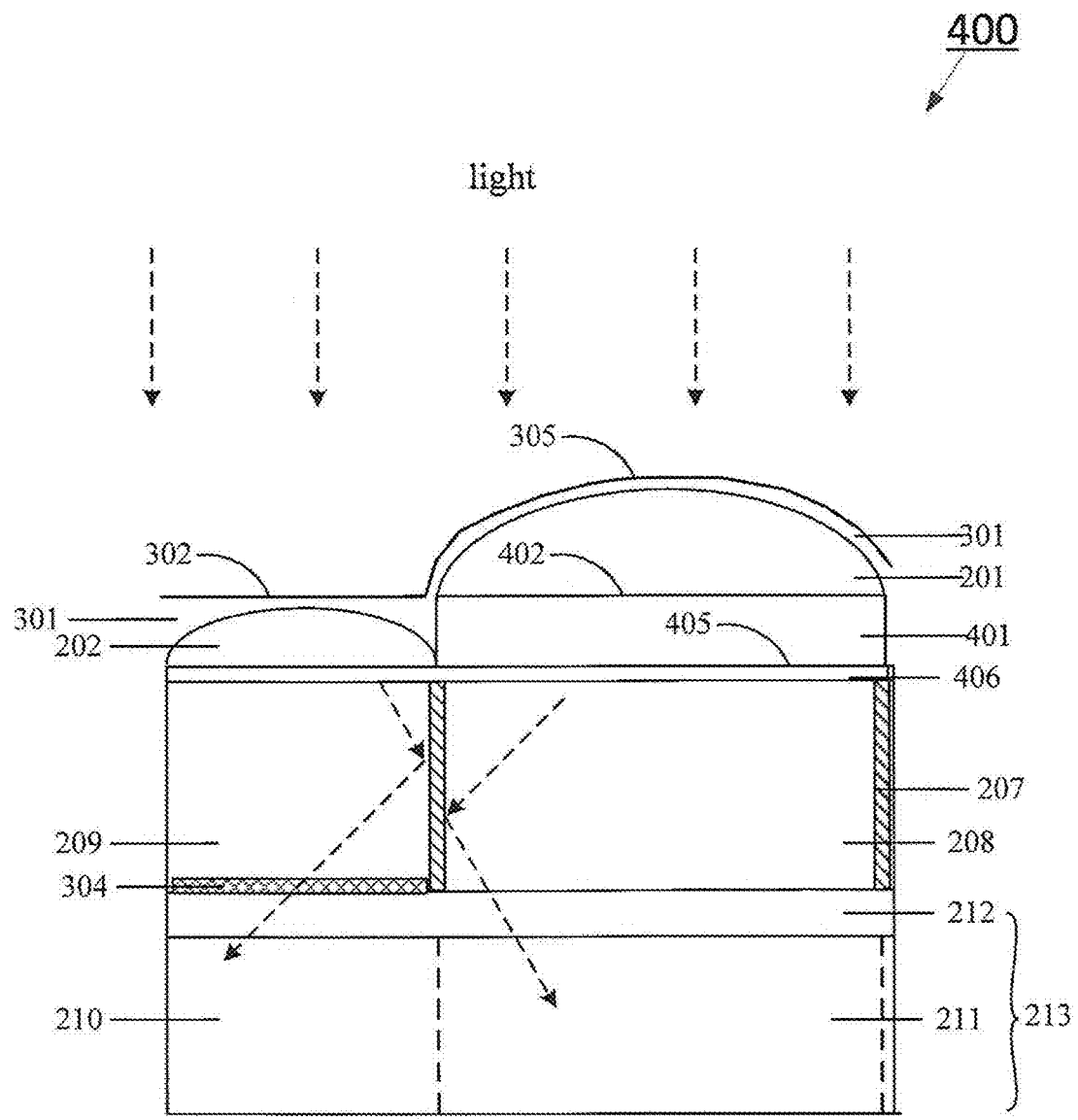
FIG. 4 is a cross-sectional view of an improved imaging sensor with big-small pixel scheme, in accordance with an embodiment of the invention.

In order to form the flat top surface 302 on the second micro-lens 202, two embodiments are depicted in FIG. 3 and FIG. 4, respectively. In one example shown in FIG. 3, both the first micro-lens 201 and the second micro-lens 202 are disposed on a surface 306 of an interlayer 307, wherein a small gap 303 is formed on purpose between the first micro-lens 201 and the second micro-lens 202, which is filled by partial of the coating layer 301. The interlayer 307 may be a single layer or multiple layer film stacks which comprise at least one of dielectric materials with a refractive index higher than the refractive index of micro-lens 201 and 202. As an example, the refractive index of the interlayer 307 is about 1.56~2.2 at 530 nm wavelength. In another example shown in FIG. 4, the second micro-lens 202 is disposed on a surface 405 of an interlayer 406. However, the first micro-lens 201 is not disposed on the surface 405. Instead, there is a buffer layer 401 disposed on the surface 405, and between the interlayer 406 and the first micro-lens 201, wherein a top surface 402 of the buffer layer 401 is at the same level of the flat coating surface 302 of the coating layer 301. The interlayer 406 could be a single layer or multiple layer film stacks which comprise at least one of dielectric materials with a refractive index higher than the refractive index of micro-lens 201 and 202. As an example, the refractive index of the interlayer 406 is about 1.56~2.2 at 530 nm wavelength. The buffer layer 401 comprises the same materials as the interlayer 406 but with the calibrated thickness to make the top surface 402 at the same level of the flat coating surface 302 of the coating layer 301.

Figure 5:
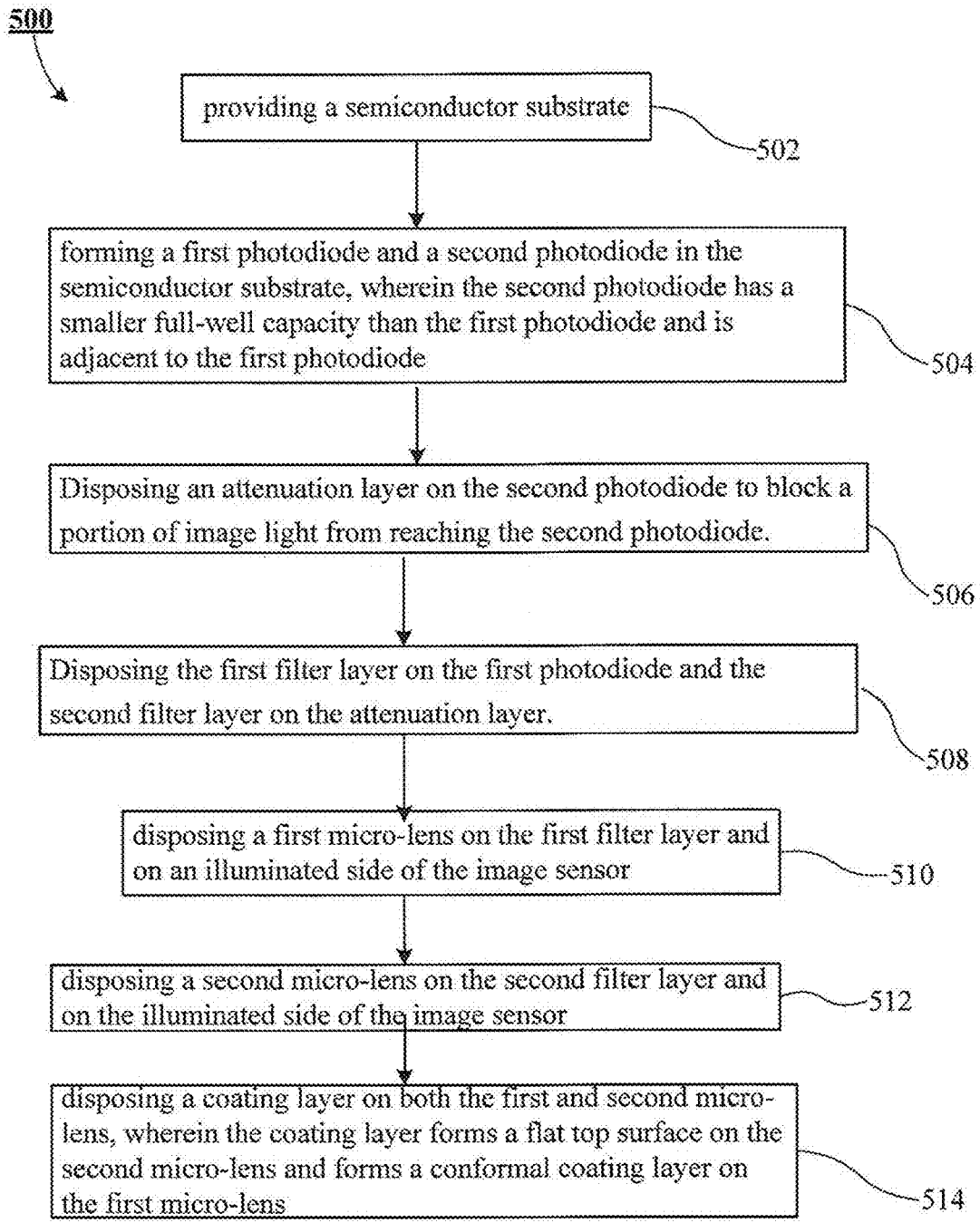
FIG. 5 is a flow chart summarizing an example method of manufacturing an improved image sensor with big-small pixel scheme, in accordance with an embodiment of the invention.

FIG. 5 describes an exemplary method 500 of manufacturing an improved image sensor with big-small pixel scheme, in accordance with an embodiment of the invention depicted in FIG. 3. The method 500 includes: providing a semiconductor substrate (step 502); forming the first photodiode 211 and the second photodiode 210 in the semiconductor substrate, wherein the second photodiode 210 has a smaller full-well capacitance than the first photodiode 211 and is adjacent to the first photodiode 211 (step 504); disposing the thin attenuation layer 304 above the second photodiode 210 to block a portion of image light from reaching the second photodiode 210 (step 506). The thin attenuation layer 304 comprises at least one of TiN, Al, $Al_2O_3$, AlCu, Cu, Ti, Ta, Ag, W, $TiO_2$, $SiO_2$, $ZrO_2$, TaO, SiN, SiNO, and $HfO_x$. The thickness of the attenuation layer 304 is approximately several nanometers. The thin attenuation layer 304 may be deposited by any kinds of thin film deposition process, such as atomic layer deposition (ALD), chemical vapor deposition (CVD) and physical vapor deposition (PVD) and the like; disposing the first filter layer 208 on the first photodiode 211 and the second filter layer 209 on the thin attenuation layer 304 (step 508). The second filter layer 209 and the first filter layer 208 have a same thickness, and they are laterally adjacent to each other with the reflective grid 207 in between. The reflective grid 207 comprises at least one of TiN and W which could be deposited by any kinds of thin film deposition process, such as ALD, CVD and PVD and the like, and patterned by any kinds of patterning process; disposing the first micro-lens 201 on the first filter layer 208 and on an illuminated side of the image sensor (step 510); disposing the second micro-lens 202 on the second filter layer 209 and on the illuminated side of the image sensor (step 512). The first micro-lens and the second micro-lens are adjacent to each other and disposed on a same surface 306, wherein there is a gap between the first micro-lens 201 and the second micro-lens 202 which will be filled by partial of the coating layer 301 in the following step 514; disposing the coating layer 301 on both the first 201 and second 202 micro-lens, wherein the coating layer 301 forms the flat top surface 302 on the second micro-lens 202 and forms the conformal coating layer 305 on the first micro-lens 201 (step 514). The coating layer 301 may be deposited by any thin film deposition process, such as ALD, CVD and PVD and the like, and patterned by any kinds of patterning process. In the exemplary method 500, a refractive index of the coating layer 301 is smaller than a refractive index of the first micro-lens 201 and a refractive index of the second micro-lens 202.

Figure 6:
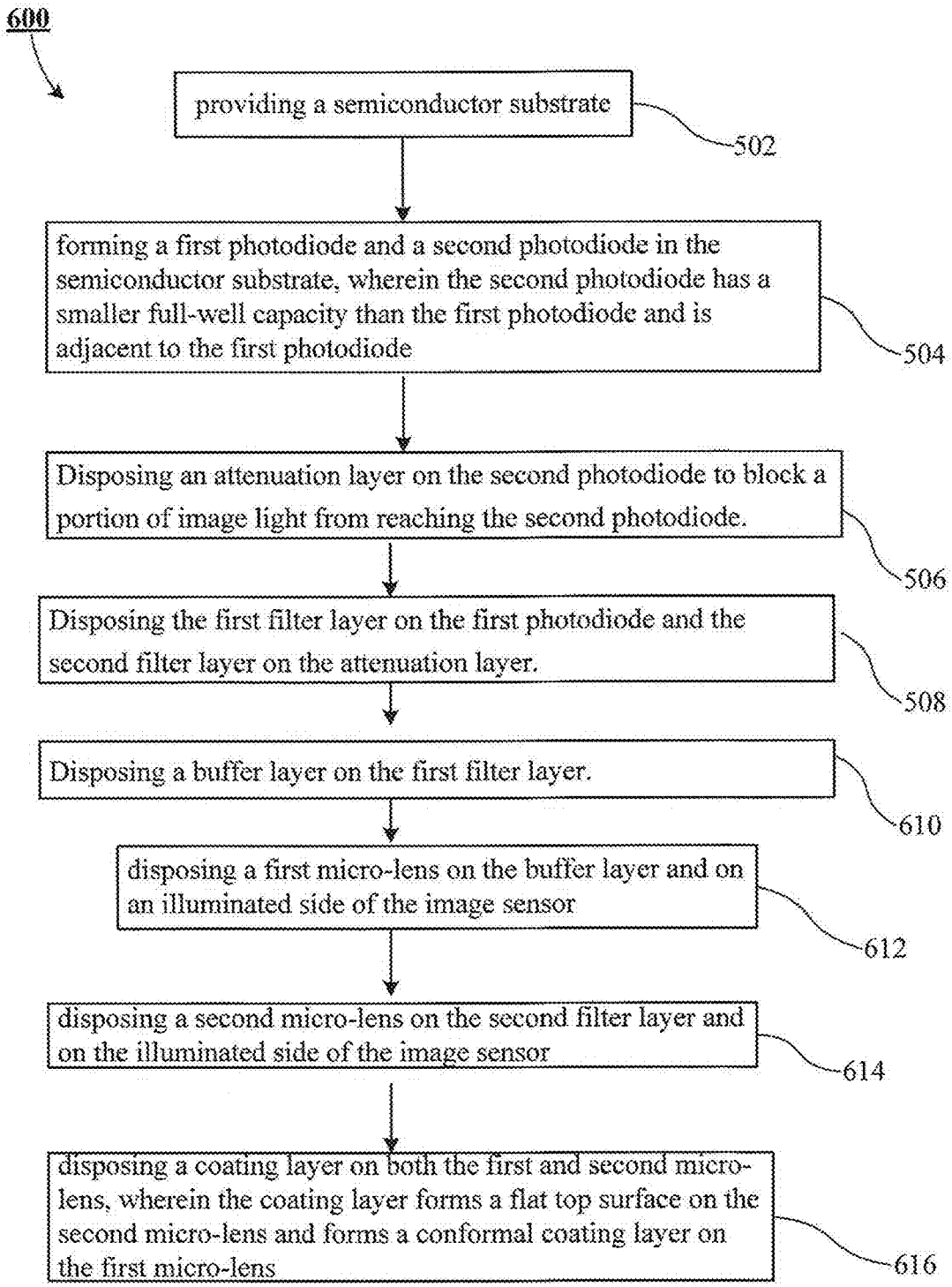
FIG. 6 is a flow chart summarizing an example method of manufacturing an improved image sensor with big-small pixel scheme, in accordance with an embodiment of the invention.

FIG. 6 describes an exemplary method 600 of manufacturing an improved image sensor with big-small pixel scheme, in accordance with an embodiment of the invention depicted in FIG. 4. Compared to the method 500 described in FIG. 5, the method 600 comprises the same steps 502, 504, 506 and 508. The method 600 further comprises: disposing the buffer layer 401 on the first filter layer 208 (step 610). The buffer layer 401 may be deposited by any kinds of thin film deposition process, such as ALD, CVD and PVD and the like, and patterned by any kinds of patterning process; disposing the first micro-lens 201 on the buffer layer 401 and on an illuminated side of the image sensor (step 162), therefore, the buffer layer 401 is disposed between the first filter layer 208 and the first micro-lens 201; disposing the second micro-lens on the second filter layer and on the illuminated side of the image sensor (step 614); and disposing the coating layer 301 on both the first 201 and second 202 micro-lens, wherein the coating layer 301 forms the flat top surface 302 on the second micro-lens 202 and forms the conformal coating layer 305 on the first micro-lens 201 (step 616), wherein the top surface 402 of the buffer layer 401 is at the same level as that of the flat coating surface 302 of the coating layer 301.

The above description of illustrated examples of the invention, including what is described in the Abstract, is not intended to be exhaustive or to limit the invention to the precise forms disclosed. While specific examples of the invention are described herein for illustrative purposes, various modifications are possible within the scope of the invention, as those skilled in the relevant art will recognize. These modifications can be made to the invention in light of the above detailed description. The terms used in the following claims should not be construed to limit the invention to the specific examples disclosed in the specification. Rather, the scope of the invention is to be determined entirely by the following claims, which are to be construed in accordance with established doctrines of claim interpretation.

What is claimed is:

1. An image sensor, comprising:
    a first photodiode disposed in a semiconductor substrate;
    a second photodiode having a smaller full-well capacitance than a full well capacitance of the first photodiode, disposed in the semiconductor substrate, wherein the second photodiode is adjacent to the first photodiode;

a first micro-lens, disposed above the first photodiode and on an illuminated side of the image sensor;

a second micro-lens, disposed above the second photodiode and on the illuminated side of the image sensor;

a first filter layer, disposed between the first micro-lens and the first photodiode, and configured to pass light within a first range of wavelengths;

a second filter layer, disposed between the second micro-lens and the second photodiode, and configured to pass light within a second range of wavelengths; wherein the second filter layer is adjacent to the first filter layer and separated by a reflective grid; and a coating layer disposed on both the first and second micro-lenses, wherein the coating layer forms a flat top surface covering the second micro-lens and extends to form a conformal coating surface covering the first micro-lens.

2. The image sensor of claim 1, wherein a refractive index of the coating layer is smaller than a refractive index of the first micro-lens and a refractive index of the second micro-lens.

3. The image sensor of claim 1, further comprising an attenuation layer disposed between the second photodiode and the second micro-lens to block a portion of incident light from reaching the second photodiode.

4. The image sensor of claim 3, wherein the attenuation layer comprises at least one of TiN, Al, Al$_2$O$_3$, AlCu, Cu, Ti, Ta, Ag, W, TiO$_2$, SiO$_2$, ZrO$_2$, TaO, SiN, SiNO, and hafnium oxide.

5. The image sensor of claim 1, wherein the refractive grid comprises at least one of TiN and W.

6. The image sensor of claim 1, wherein the first micro-lens and the second micro-lens are adjacent to each other and disposed on a same surface, wherein there is a gap between the first micro-lens and the second micro-lens which is filled by part of the coating layer.

7. The image sensor of claim 1, further comprising a buffer layer disposed between the first filter layer and the first micro-lens, wherein a top surface of the buffer layer is at the same level as that of the flat top surface of the coating layer.

8. An imaging system, comprising:

a plurality of first photodiodes and a plurality of second photodiodes in a semiconductor substrate, wherein each of the second photodiodes has a smaller full-well capacitance than a full well capacitance of each respective adjacent first photodiode of the plurality of first photodiodes;

a plurality of first micro-lenses, wherein each of the plurality of first micro-lenses is disposed above each respective first photodiode of the plurality of first photodiodes and on an illuminated side of an image sensor;

a plurality of second micro-lenses, wherein each of the plurality of second micro-lenses is disposed above each respective second photodiode of the plurality of second photodiodes and on the illuminated side of the image sensor;

a first filter layer disposed between each of plurality of the first micro-lenses and each respective first photodiode of the plurality of first photodiodes, and configured to pass light within a first range of wavelengths;

a second filter layer disposed between each of the plurality of second micro-lenses and each respective second photodiode of the plurality of second photodiodes, and configured to pass light within a second range of wavelengths; wherein the second filter layer is adjacent to the first filter layer and separated by a reflective grid; and a coating layer disposed on both the plurality of first and second micro-lenses, wherein the coating layer forms a flat top surface covering each respective second micro-lens of the plurality of second micro-lenses and extends to form a conformal coating surface covering each respective first micro-lens of the plurality of first micro-lenses.

9. The imaging system of claim 8, wherein a refractive index of the coating layer is smaller than a refractive index of each respective first micro-lens of plurality of the first micro-lenses and a refractive index of each respective second micro-lens of the plurality of second micro-lenses.

10. The imaging system of claim 8, further comprising an attenuation layer disposed between each second photodiode of the plurality of the second photodiodes and each respective second micro-lens of the plurality of the second micro-lenses to block a portion of image light from reaching the second photodiode.

11. The imaging system of claim 10, wherein the attenuation layer comprises at least one of TiN, Al, Al$_2$O$_3$, AlCu, Cu, Ti, Ta, Ag, W, TiO$_2$, SiO$_2$, ZrO$_2$, TaO, SiN, SiNO, and hafnium oxide.

12. The imaging system of claim 8, wherein the reflective grid comprises at least one of TiN and W.

13. The imaging system of claim 8, wherein each of the plurality of first micro-lenses and each of the plurality of second micro-lenses are adjacent to each other and disposed on a same surface, wherein there is a gap between each of the plurality of first micro-lenses and each respective second micro-lens of the plurality of second micro-lenses which is filled by part of the coating layer.

14. The imaging system of claim 8, further comprising a buffer layer disposed between the first filter layer and each respective first micro-lens of the plurality of first micro-lenses, wherein a top surface of the buffer layer is at the same level as that of the flat top surface of the coating layer.

15. A method for manufacturing an imaging system, comprising:

providing a semiconductor substrate;

forming a plurality of first photodiodes and a plurality of second photodiodes in the semiconductor substrate, wherein each of the plurality of second photodiodes has a smaller full-well capacitance than a full-well capacitance of each respective adjacent first photodiode of the plurality of first photodiodes;

disposing a plurality of first micro-lenses, wherein each first micro-lens of the plurality of first micro-lenses is disposed above each respective first photodiode of the plurality of first photodiodes and on an illuminated side of an image sensor;

disposing a plurality of second micro-lenses, wherein each of the plurality of second micro-lenses is disposed above each respective second photodiode of the plurality of second photodiodes and on the illuminated side of the image sensor;

disposing a first filter layer between each of the plurality of first micro-lenses and each respective first photodiode of the plurality of first photodiodes, and configured to pass light within a first range of wavelengths;

disposing a second filter layer between each of the plurality of second micro-lenses and each respective second photodiode of the plurality of second photodiodes, and configured to pass light within a second range of wavelengths; wherein the second filter layer is adjacent to the first filter layer and separated by a reflective grid; and disposing a coating layer on both the plurality of first and second micro-lenses, wherein the coating layer forms a flat top surface covering each respective second micro-lens of the plurality of second micro-lenses and extends to form a conformal coating surface on each respective first micro-lens of the plurality of first micro-lenses.

16. The method of claim 15, wherein a refractive index of the coating layer is smaller than a refractive index of each respective first micro-lens of the plurality of first micro-lenses and a refractive index of each respective second micro-lens of the plurality of second micro-lenses.

17. The method of claim 15, further comprising disposing an attenuation layer between each of the plurality of second photodiodes and each respective second micro-lens of the plurality of second micro-lenses to block a portion of incident light from reaching each respective second photodiode of the plurality of second photodiodes.

18. The method of claim 17, wherein the attenuation layer comprises at least one of TiN, Al, $Al_2O_3$, AlCu, Cu, Ti, Ta, Ag, W, $TiO_2$, $SiO_2$, $ZrO_2$, TaO, SiN, SiNO, and hafnium oxide.

19. The method of claim 15, wherein the reflective grid comprises at least one of TiN and W.

20. The method of claim 15, wherein each respective first micro-lens of the plurality of first micro-lenses and each respective second micro-lens of the plurality of second micro-lenses are adjacent to each other and disposed on a same surface, wherein there is a gap between each respective first micro-lens of the plurality of first micro-lenses and each respective second micro-lens of the plurality of second micro-lenses which is filled by part of the coating layer.

21. The method of claim 15, further comprising disposing a buffer layer between the first filter layer and each respective first micro-lens of the plurality of first micro-lenses, wherein a top surface of the buffer layer is at the same level as that of the flat top surface of the coating layer.

* * * * *